United States Patent
Chan

(10) Patent No.: US 8,018,266 B2
(45) Date of Patent: Sep. 13, 2011

(54) LEVEL SHIFTING CIRCUIT

(75) Inventor: Chien-Ting Chan, Yongjing Township, Changhua County (TW)

(73) Assignees: Dongguan Masstop Liquid Crystal Display Co., Ltd., Dongguan, Guangdong Province (CN); Wintek Corporation, Taichung (TW)

( * ) Notice: Subject to any disclaimer, the term of this patent is extended or adjusted under 35 U.S.C. 154(b) by 0 days.

(21) Appl. No.: 12/839,759

(22) Filed: Jul. 20, 2010

(65) Prior Publication Data

US 2011/0025398 A1    Feb. 3, 2011

(30) Foreign Application Priority Data

Jul. 31, 2009 (TW) ................................ 98125994 A

(51) Int. Cl.
*H03L 5/00* (2006.01)
(52) U.S. Cl. ............................ 327/333; 326/62; 326/80
(58) Field of Classification Search .............. 326/62–63, 326/80–82; 327/306, 333
See application file for complete search history.

(56) References Cited

U.S. PATENT DOCUMENTS 6,717,460 B2 * 4/2004 Yamauchi et al. ............ 327/544
7,598,771 B2 * 10/2009 Chen et al. ...................... 326/80

* cited by examiner

*Primary Examiner* — Dinh T. Le
(74) *Attorney, Agent, or Firm* — Thomas|Kayden

(57) ABSTRACT

A level shifting circuit including a driving circuit, a reset circuit, a coupling circuit and an output-stage circuit is provided. The driving circuit, controlled by the input signal, controls the first driving signal having a high voltage level in the first period and controls the first driving signal having a low reference level in the second period. The reset circuit, controlled by the first driving signal in the first period, resets the second driving signal having the low reference level. The coupling circuit, controlled by the falling edge of the input-inversed signal, controls the second driving signal having a low voltage coupling level in the second period. The output-stage circuit, controlled by the first and the second driving signal, controls the output signal having a high voltage level in the second period and controls the output signal having a low voltage level in the first period.

6 Claims, 3 Drawing Sheets

LEVEL SHIFTING CIRCUIT

This application claims the benefit of Taiwan application Serial No. 098125994, filed Jul. 31, 2009, the subject matter of which is incorporated herein by reference.

BACKGROUND OF THE INVENTION

1. Field of the Invention

The invention relates in general to a level shifting circuit, and more particularly to an output voltage signal whose level is lower than a grounding level by using capacitor coupling effect.

2. Description of the Related Art

Nowadays, the level shifting circuit, which had been maturely developed, is widely used in various circuit applications. Referring to FIG. 1A and FIG. 1B, circuit diagrams of a level boosting shifter and a level stepping-down shifter of a conventional level shifting circuit are respectively shown. For example, the level boosting shifter 1 includes two groups of inverters A and B and transistors T1 and T2. The transistors T1 and T2 respectively provides a high voltage level HV for the inverters A and inverter B in response to the output signal So and the output-inverse signal SoB.

The inverters A and B respectively are controlled by the input signal Si and the input-inversed signal SiB to provide an output signal SoB and an output-inverse signal So, wherein the levels of the input signal Si and the input-inversed signal SiB are switched between a high reference level Vdd and a low reference level Vg, the levels of the output signal SoB and the output-inverse signal So are switched between high voltage level signal HV and the low reference level Vg, and the level of the high voltage level signal HV is higher than the high reference level Vdd. Thus, the level shifter 1 may generate the output signal So with level ranges between the high voltage level HV and the low reference level Vg according to the input signal Si with level ranges between the high reference level Vdd and the low reference level Vg.

The level stepping-down shifter 1', which steps down the level of the signal, generates an output signal So with level ranges between the high voltage level HV and the low voltage level LV according to the output signal So and the output-inverse signal So'. In other words, the conventional level shifting circuit which simultaneously boosts the high signal level (equivalent to the high reference level Vdd) of the input signal Si to the high voltage level HV and steps down the low signal level (equivalent to the low reference level Vg) of the input signal Si to the low voltage level LV is implemented by two stages respectively including a level boosting shifter 1 and a level stepping-down shifter 1' each having six transistors. Therefore, the conventional shift register will be more costive.

SUMMARY OF THE INVENTION

The invention is directed to a level shifting circuit, which generates a driving signal by using a capacitor in response to the falling edge of the input-inversed signal to drive the output signal equal to a low voltage level, and generates another driving signal by using two-stage inverters being serially connected to drive the output signal equal to a high voltage level. Compared with the conventional level shifting circuit, the relevant level shifting circuit of the invention has the advantages of employing fewer circuits and simpler circuit structure and incurring lower cost.

According to a first aspect of the present invention, a level shifting circuit is provided. The level shifting circuit generates an output signal according to the input signal and the input-inversed signal. The level shifting circuit includes a driving circuit, a reset circuit, a coupling circuit and an output-stage circuit. The driving circuit, controlled by the input signal, controls the first driving signal having a high voltage level in the first period and controls the first driving signal having a low reference level in the second period. The reset circuit, controlled by the first driving signal, resets the second driving signal having the low reference level in the first period. The coupling circuit, controlled by the falling edge of the input-inversed signal, controls the second driving signal having a low voltage coupling level in the second period. The output-stage circuit, controlled by the first and the second driving signal, controls the output signal having a high voltage level in the second period and controls the output signal having a low voltage level in the first period.

The invention will become apparent from the following detailed description of the preferred but non-limiting embodiments. The following description is made with reference to the accompanying drawings.

DETAILED DESCRIPTION OF THE INVENTION

The level shifting circuit of the present embodiment of the invention, in response to the falling edge of the input-inversed signal, generates a driving signal to control the level of the output signal equal to a low voltage level by using a capacitor, and generates another driving signal to control the level of the output signal equal to a high voltage level by using two-stage inverters being serially connected.

Figure 1A:
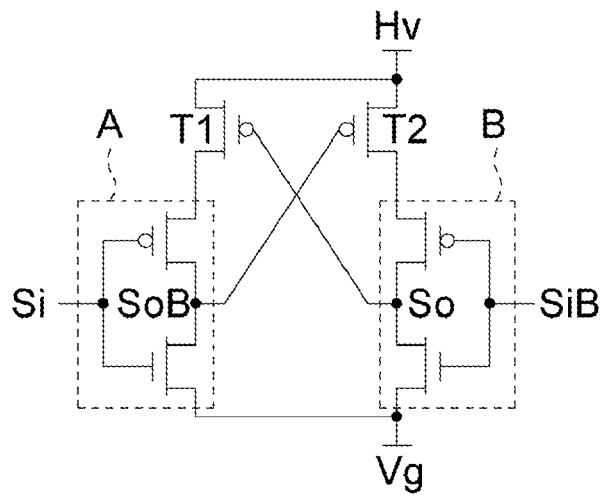
FIG. 1A and FIG. 1B respectively show circuit diagrams of a level boosting shifter and a level stepping-down shifter of a conventional level shifting circuit.
Figure 1B:
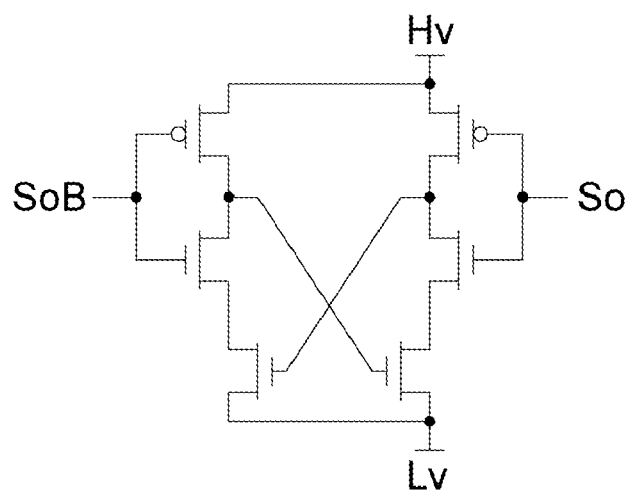
Figure 2:
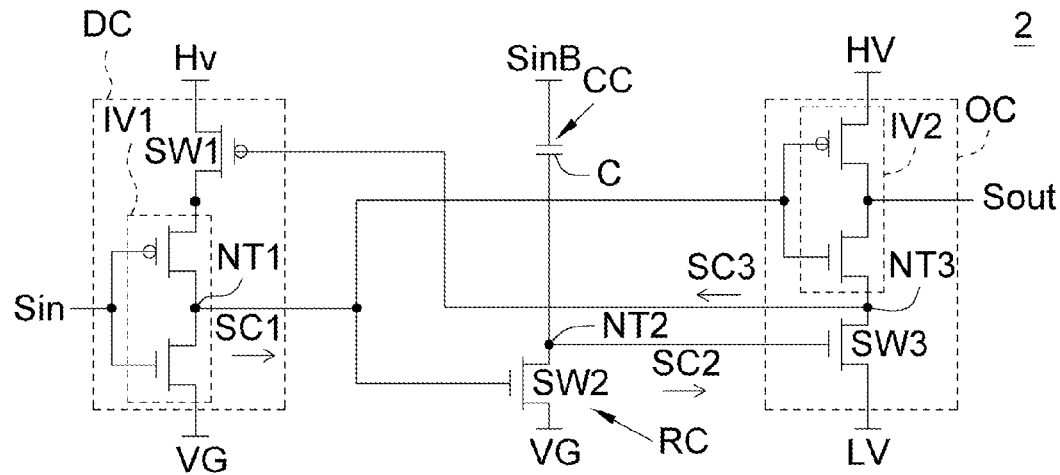
FIG. 2 shows a circuit diagram of a level shifting circuit according to an embodiment of the invention.

Referring to FIG. 2, a circuit diagram of a level shifting circuit according to an embodiment of the invention is shown. The level shifting circuit 2 generates an output signal Sout according to an input signal Sin and an input-inversed signal SinB. For example, the levels of the input signal Sin and the input-inversed signal SinB are switched between a high reference level VDD and a low reference level VG, and the level of the output signal Sout is switched between a high voltage level HV and a low voltage level LV.

The level shifting circuit 2 includes a driving circuit DC, a reset circuit RC, a coupling circuit CC and an output-stage circuit OC. The driving circuit DC controlled by the input signal Sin controls the driving signal SC1 to follow the high voltage level HV in the period TP1, and controls the driving signal SC1 to follow a low reference level VG in the period TP2. In an example, the driving circuit DC includes a node NT1, a switch SW1 and an inverter IV1. The node NT1 has a driving signal SC1.

The switch SW1 is implemented by a P-type metal oxide semiconductor (PMOS) transistor for example, wherein the source receives a signal corresponding to the high voltage level HV, the drain is coupled to the node NT1, and the gate is coupled to the node NT3 to receive a control signal SC3. The inverter IV1 is a complementary metal oxide semiconductor (COMS) inverter for example, wherein its input end receives the input signal Sin and output end is coupled to the node NT1 to provide the driving signal SC1. The inverter IV1 further includes a first node for receiving a high voltage level HV and a second node for receiving a voltage signal having a level equal to the low reference level VG. The first node is coupled to the drain of the switch SW1.

The reset circuit RC controlled by the driving signal SC1 resets the driving signal SC2 to follow a low reference level VG in the period TP1. In an example, the reset circuit RC includes a node NT2 and a switch SW2. The node NT2 has the driving signal SC2. The switch SW2 is implemented by an N-type metal oxide semiconductor (NMOS) transistor for example, wherein the drain is coupled to the node NT2, the source receives a voltage signal corresponding to the low reference level VG, and the gate is coupled to the node NT1 to receive the driving signal SC1.

The coupling circuit CC controlled by the falling edge of the input-inversed signal SinB controls the driving signal SC2 to follow a low voltage coupling level LCL in the period TP2. In an example, the coupling circuit CC includes a capacitor C, wherein its first end receives the input-inversed signal SinB and its second end is coupled to the node NT2.

The output-stage circuit OC controlled by the driving signal SC1 and SC2 controls the output signal Sout to follow a high voltage level HV in the period TP2, and controls the output signal Sout to follow a low voltage level LV in the period TP1. In an example, the output-stage circuit OC includes a node NT3, a switch SW3 and an inverter IV2.

The node NT3 has a driving signal SC3. The switch SW3 is implemented by an NMOS transistor for example, wherein the drain is coupled to the node NT2, the source receives a voltage signal with the low voltage level LV, and the gate is coupled to the node NT2 to receive the driving signal SC2. The inverter IV2 is a CMOS inverter for example, wherein its input end is coupled to the node NT1 to receive the driving signal SC1 and its output end provides the output signal Sout. The inverter IV2 further includes a first node for receiving the high voltage level HV and a second node for receiving the low voltage level LV. The second node coupled to the drain of the switch SW3.

Figure 3:
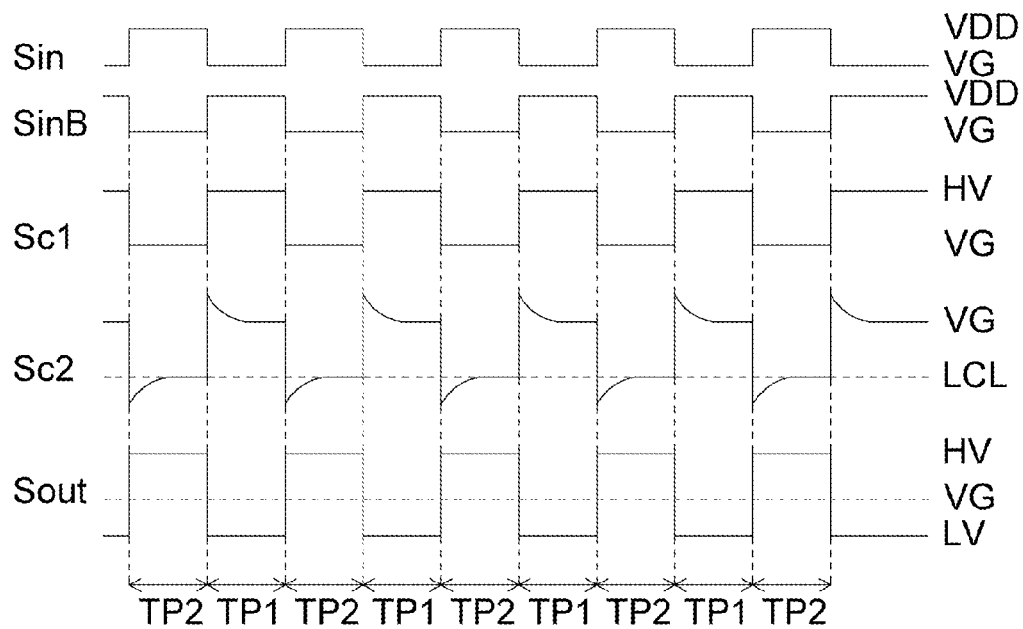
FIG. 3 shows a relevant signal timing diagram of the level shifting circuit of FIG. 2.

Referring to FIG. 3, a relevant signal timing diagram of the level shifting circuit of FIG. 2 is shown. In the period TP1, the input signal Sin has a low reference level VG, and the input-inversed signal SinB has a high reference level VDD. Thus, the switch SW1 is conducted, and the inverter IV correspondingly provides the driving signal SC1 having a high voltage level HV for conducting the switch SW2, so that the driving signal SC2 has a low reference level VG. Meanwhile, the switch SW3 is controlled and conducted by the driving signal having a low reference level VG, so that the control signal SC3 has a low voltage level LV. The inverter INV2 generates the output signal Sout having a low voltage level LV in response to the driving signal SC1 having a high voltage level HV.

At the time point between period TP1 and period TP2, the input signal SinB activates the signal falling edge switched to the low reference level VG from the high reference level VDD. Besides, the capacitor C, in response to the signal falling edge of the input signal SinB, couples a delta voltage to the node NT2, so that the level of the driving signal SC2 is stepped down to the low voltage coupling level LCL from the low reference level VG. For example, the delta voltage is close to the absolute value of the difference between the high signal level (equal to high reference level VDD) and the low signal level (equal to the low reference voltage level VG) of the input-inversed signal SinB. For example, if the high reference level VDD and the low reference level VG are respectively 5V and 0V, then the differential voltage is close to 5V, and the low voltage coupling level LCL is close to −5V.

In the period TP2, the input signal Sin has a high reference level VDD. Thus, the inverter IV1 correspondingly provides the driving signal SC1 having a low reference level VG to turn off the switch SW2, so that the level of the driving signal SC2 maintains at the low voltage coupling level LCL to correspondingly turn off the switch SW3. The inverter IV2 correspondingly provides the output signal Sout having a high voltage level HV. Meanwhile, the node NT3 is substantially floating, and the control signal SC3 is close to the high voltage level HV to turn off the switch SW1.

Figure 4A:
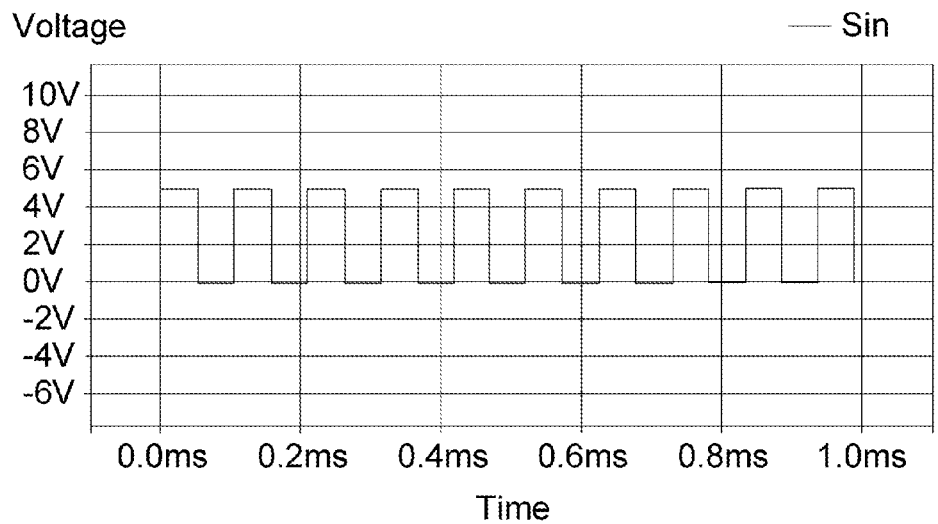
FIG. 4A and FIG. 4B show relevant signal timing diagrams of the level shifting circuit of FIG. 2.
Figure 4B:
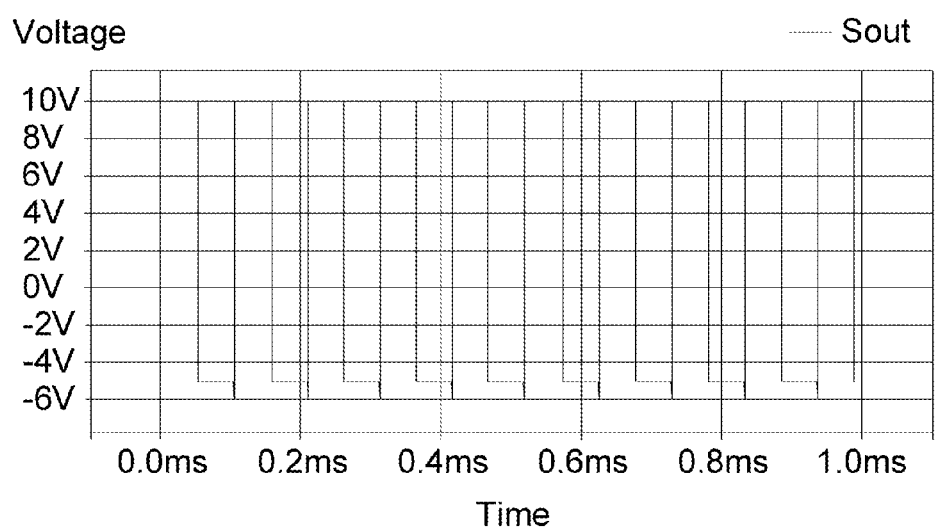

Referring to FIG. 4A and FIG. 4B, relevant signal timing diagrams of the level shifting circuit of FIG. 2 are shown. For example, the high reference level VDD is equal to 5V (Volt), and the high voltage level HV and the low voltage level LV respectively are equal to 10V and −5V. In an example, the operation of the level shifting circuit 2 includes two timing periods TP1 and TP2. According to the above simulation conditions, it is obtained that the level of the output signal Sout is switched between 10V and −5V.

According to the above disclosure, presuming the circuit structure includes seven transistors (the inverters IV1 and IV2 are CMOS inverters including an NMOS and a PMOS) and a capacitor, the level shifting circuit 2 of the present embodiment of the invention may generate the output signal Sout whose level is switched between the high voltage level HV and the low voltage level LV in response to the input signal Sin and the input-inversed signal SinB, wherein the levels of the input signal Sin and the input-inversed signal SinB are switched between the high reference level VDD and the low reference level VG.

The level shifting circuit of the present embodiment of the invention which generates a driving signal by using a capacitor in response to the falling edge of the input-inversed signal to drive the output signal equal to a low voltage level, and generates another driving signal by using two-stage inverters being serially connected to drive the output signal equal to a high voltage level. Compared with the conventional level shifting circuit, the relevant level shifting circuit of the invention has the advantages of employing fewer circuit devices and simpler circuit structure and lower cost.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A level shifting circuit generating an output signal according to an input signal and an input-inversed signal, wherein the level shifting circuit comprises:
   a driving circuit, comprising a first inverter having a first output end, the driving circuit controlled by the input signal to produce a first driving signal having a high voltage level from the first output end in a first period, and produce the first driving signal having a low reference level from the first output end in a second period;
   a reset circuit having an output node for generating a second driving signal, the reset circuit controlled by the first driving signal to reset the second driving signal having the low reference level in the first period;
   a coupling circuit controlled by the falling edge of the input-inversed signal to control the second driving signal, so that the second driving signal has a low voltage coupling level in the second period; and an output-stage circuit, comprising a second inverter having a second output end, the output-stage circuit controlled by the first and the second driving signals to produce the output signal having the high voltage level from the second output end in the second period and produce the output signal having a low voltage level from the second output end in the first period.

2. The level shifting circuit according to claim 1, wherein the driving circuit comprises:

a first node; and a first switch, connected to the first inverter via the first node, wherein the first switch comprises a first input end and a second input end, with the first input end receives a high voltage signal, the second input end is coupled to the first node, the first switch is controlled by a third control signal to provide the high voltage signal to the first node in the first period;

wherein the first inverter controlled by the input signal to provide the high voltage signal on the first node as the first driving signal in the first period and provide a reference voltage having the low reference level as the first driving signal in the second period.

3. The level shifting circuit according to claim 2, wherein the output-stage circuit comprises:

a second node; and a second switch, connected to the second inverter via the second node, wherein the second switch comprising a first input end and a second input end, with the first input end receives a low level signal, the second input end is coupled to the second node, the second switch is controlled by the second driving signal to provide the low level signal to the second node in the second period, and the low level signal has the low voltage level;

wherein the second inverter controlled by the first driving signal to provide the high voltage signal as the output signal in the first period and provide the low level signal on the second node as the output signal in the second period.

4. The level shifting circuit according to claim 3, wherein the second node has the third driving signal for controlling the first switch to perform operation.

5. The level shifting circuit according to claim 1, wherein the reset circuit comprises:

a switch, connected to the coupling circuit via the output node, wherein the switch comprising a first input end and a second input end, with the first input end is coupled to the output node, the second input end receives a low reference voltage signal, the switch is controlled by the first driving signal to provide the low reference voltage signal as the second driving signal in the first period, and the reference voltage signal has the low reference level.

6. The level shifting circuit according to claim 5, wherein the coupling circuit comprises:

a capacitor, wherein the first end receives the input-inversed signal, the second end is coupled to the output node, and in response to the falling edge of the input-inversed signal, the capacitor couples a delta voltage to the output node, so that the level of the second driving signal is stepped down to the low voltage coupling level from the low reference level;

wherein the delta voltage is close to an absolute value of a difference between the input signal and the input-inversed signal.

* * * * *